(12) United States Patent
Lee

(10) Patent No.: US 6,680,635 B2
(45) Date of Patent: Jan. 20, 2004

(54) APPARATUS AND METHOD FOR GENERATING OUTPUT CLOCK SIGNAL HAVING CONTROLLED TIMING

(75) Inventor: Seong Hoon Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/315,370

(22) Filed: Dec. 10, 2002

(65) Prior Publication Data

US 2003/0117192 A1 Jun. 26, 2003

(30) Foreign Application Priority Data

Dec. 21, 2001 (KR) ................. 10-2001-0082674

(51) Int. Cl.[7] ............................... H03L 7/06
(52) U.S. Cl. .................. 327/158; 327/161; 327/149
(58) Field of Search ................. 327/158, 149, 327/152, 153, 161, 270, 276

(56) References Cited

U.S. PATENT DOCUMENTS 6,229,368 B1 * 5/2001 Lee ........................... 327/292
6,327,318 B1 * 12/2001 Bhullar et al. ............. 375/374
6,466,071 B2 * 10/2002 Kim et al. .................. 327/175
6,573,771 B2 * 6/2003 Lee et al. ................... 327/158

* cited by examiner

Primary Examiner—Timothy P. Callahan
Assistant Examiner—Cassandra Cox
(74) Attorney, Agent, or Firm—Ladas & Parry

(57) ABSTRACT

A delay locked loop circuit for improving the jitter index using a phase blender. The present delay locked loop circuit comprises a first delay circuit which receives an input clock signal in order to generate a first delayed input clock signal, and a second delay circuit which receives an input clock signal in order to generate a second delayed input clock signal. The first delayed input clock signal is an input clock signal delayed by a period determined according to a first delay control signal inputted to the first delay circuit. The second delayed input clock signal is an input clock signal delayed by a period determined according to a second delay control signal inputted to the second delay circuit. A phase blending circuit receives the first and second delayed input clock signals, blends the phases of the first and second delayed input clock signals, and generates a phase blended clock signal. In addition, a phase detection circuit is provided to receive a reference clock signal and the phase blended clock signal, generate a phase push signal PUSH in the case that the phase of the phase blended clock signal is ahead of that of the reference clock signal, and generate a phase pull signal PULL in the case that the phase of the phase blended clock signal is behind that of the reference clock signal.

19 Claims, 7 Drawing Sheets

(a)

(b)

APPARATUS AND METHOD FOR GENERATING OUTPUT CLOCK SIGNAL HAVING CONTROLLED TIMING

BACKGROUND OF THE INVENTION

1. Field of the Invention

The present invention relates to an apparatus and method for generating an output clock signal having controlled timing, and more particularly to a delay locked loop circuit for ameliorating jitter problems by using a phase blender. A clock-generating apparatus according to the present invention is particularly applicable to semiconductor memory devices and also to all semiconductor apparatuses and computer systems, etc., which require a delay locked loop circuit.

2. Description of the Prior Art

As generally known in the art, the Delay Locked Loop (hereinafter, referring to as "DLL") circuit is a clock-generating apparatus for compensating for a skew between an external clock and data, or between an external clock and an internal clock. FIG. 1 is a block diagram showing an example of a conventional DLL circuit. In the conventional DLL circuit 100, an input buffer 101 receives an external clock signal exCLK or a reference clock signal and converts it into an internal clock signal inCLK or an input clock signal having a signal level adapted to an internal circuit. A variable delay line 103 receives the internal clock inCLK provided from the input buffer 101 and then delays the clock by a predetermined time period, thereby generating an output clock signal dllCLK. A phase detection circuit 105 receives the generated output clock signal dllCLK and the external clock signal exCLK to detect any possible phase difference between the two clock signals. In the case that the phase of an output clock signal dllCLK is ahead of that of an external clock signal exCLK, a phase push signal PUSH is generated. Conversely, in the case that the phase of the output clock signal dllCLK is behind that of the external clock signal, a phase pull signal PULL is generated. Hereinafter, the phase push signal PUSH and phase pull signal PULL are generically referred to as "phase detection signal".

Referring to FIG. 1, a DLL circuit 100 is provided to arrange the output clock signal dllCLK and the external clock signal exCLK. The phase detection circuit 105 detects the phase difference between the output clock signal dllCLK and the external clock signal exCLK to generate the phase pull signal PLL and the phase push signal PUSH. However, inputs to the phase detection circuit 105 are not limited to the above signals, and may also include the internal clock signal inCLK and the output clock signal dllCLK, etc. A line control circuit 107 receives the phase push signal PUSH or the phase pull signal PULL from the phase detection circuit 105, and then generates a control signal CTRL for controlling a delay on a variable delay line 104. Subsequently, the line control circuit 107 provides the signal CTRL to the variable delay line 103.

The DLL circuit 100 shown in FIG. 1 is provided for obtaining the output clock signal dllCLK having the same phase as the external clock signal exCLK mentioned above. This can be achieved by appropriately controlling the delay on the variable delay line 103. The phase detection circuit 105 compares the phase of the external clock signal exCLK with that of the output clock signal dllCLK. If the phase detection circuit 105 determines that the phase of the output clock signal dllCLK is behind that of the external clock signal exCLK, the phase detection circuit 105 activates the phase push signal PUSH. If the phase push signal PUSH is provided to the delay line control circuit 107, the delay line control circuit 107 generates a control signal CTRL responding to the signal PUSH to add a little delay to the variable delay line 103. Through this process, the delay is increased more and more, and as a result, the phase of the output clock signal dllCLK becomes close to the phase of the external clock signal exCLK. Conversely, if the phase detection circuit 105 determines that the phase of the output clock signal dllCLK is behind that of the external clock signal exCLK, the phase detection circuit 105 activates the phase pull signal PULL. This results in decreasing the delay little by little on the variable delay line 103 through the delay line control circuit 107. Through this process, the phase of the output clock signal dllCLK becomes the same as that of the external clock signal exCLK. Under these conditions, the phase of the output clock signal dllCLK is changed by the increased or decreased delay (the delay is a minimum variable delay, and hereinafter, for convenience, referring to as "unit delay") responding to the phase push signal PUSH or the phase pull signal PULL with the center of the phase of the external clock signal exCLK.

The DLL has various performance indexes, and an important one among the indexes is a jitter index. Jitter means a measured value by which the phase of the DLL output signal waves back and forth. The smaller the value gets, the better performance of the DLL gets. An important one among many factors affecting the jitter index is the unit delay on the variable delay line. Accordingly, the jitter index can be improved by decreasing the unit delay.

In order to decrease the unit delay, a method for improving the variable delay line itself has been developed recently. Also, various types of variable delay lines capable of decreasing the unit delay have been developed. However, as things stand now, because the development of the variable line itself has nearly reached its limits of possibility, to further decrease the unit delay has become very difficult.

SUMMARY OF THE INVENTION

Accordingly, the present invention has been made to solve the above-mentioned problems occurring in the prior art, and an object of the present invention is to provide an apparatus and method capable of decreasing the next unit delay in a DLL easily without decreasing the unit delay of a variable delay line itself.

Also, another object of the present invention is to provide a delay locked loop circuit for improving the jitter index using a phase blender In accordance with one aspect of the present invention, the above and other objects can be accomplished by the provision of a circuit for generating an output clock signal having controlled timing, which comprises a first delay circuit which receives an input clock signal in order to generate a first delayed input clock signal, and a second delay circuit which receives an input clock signal in order to generate a second delayed input clock signal.

The first delayed input clock signal is an input clock signal delayed by a period determined according to a first delay control signal inputted to the first delay circuit. The second delayed input clock signal is an input clock signal delayed by a period determined according to a second delayed control signal inputted to the second delay circuit. Also, the clock-generating circuit in accordance with the present invention includes a phase blending circuit for receiving the first and second delayed input clock signals and blending phases of the first and second delayed input signals to generate a phase blended clock signal. The present clock-generating circuit further includes a phase detection circuit and a delay control circuit. After the phase detection circuit receives a reference clock signal and the phase blended clock signal, the phase detection circuit generates a phase push signal in the case that the phase of the phase blended clock signal is ahead of that of the reference clock signal, and generates a phase pull signal in the case that the phase of the phase blended clock signal is behind that of the reference clock signal. The delay control circuit generates a first or second delayed control signal for increasing the delay when receiving the phase push signal from the phase detection circuit and for decreasing the delay when receiving the phase pull signal from the phase detection circuit. The first control signal and the second control signal are generated in alternation. Thus, the first delay control signal and the second delay control signal are not generated simultaneously. In accordance with the present invention described above, it is possible to decrease an effective unit delay easily without decreasing the unit delay of the variable delay line itself, by using one more variable delay line in addition to the present conventional construction and generating a signal having an intermediate phase between the output signals from both variable delay lines.

Preferably, an input buffer is provided to generate an input clock signal by receiving and buffering the reference clock signal. In addition, an output buffer is provided to generate an output clock signal by receiving and buffering the phase blended clock signal. This output clock signal is generated and then supplied to the phase detection circuit, instead of the phase blended clock signal. Also, it is desirable to further provide a dummy delay circuit which receives the output clock signal in order to generate a feedback clock signal. The feedback clock signal is the output clock signal delayed by the delay period generated in the input buffer. In this case, the input clock signal is provided to the phase detection circuit instead of the reference clock signal, and the feedback clock signal is provided to the phase detection circuit, instead of the output clock signal. Also, it is desirable to further provide a dummy delay circuit which receives the output clock signal in order to generate a feedback clock signal. The feedback clock signal is the output clock signal delayed by a predetermined delay period. In this case, the feedback clock signal is provided to the phase detection circuit, instead of the output clock signal.

In accordance with another aspect of the present invention, the above and other objects can be accomplished by the provision of a method for generating a clock signal having controlled timing. Firstly, after an input clock signal and a first delay control signal are received, the input clock signal is delayed by a period determined according to the first delay control signal in order to generate a first delayed input clock signal. Also, after the input clock signal and a second delay control signal are received, the input clock signal is delayed by a period determined according to the second delay control signal in order to generate a second delayed input clock signal. Then, after these first and second delayed input clock signals are received, the first and second delayed input clock signals are blended to generate a phase blended clock signal. Then, after the reference clock signal and the phase blended clock signal are received, in the case that the phase of the phase blended clock signal is ahead of that of the reference clock signal, a phase push signal is generated, and in the case that the phase of the phase blended clock signal is behind that of the reference clock signal, a phase pull signal is generated. Then, a first delay control signal and a second delay control signal are provided to increase the delay when the phase push signal is generated, or on the other hand decrease the delay when the phase pull signal is generated.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
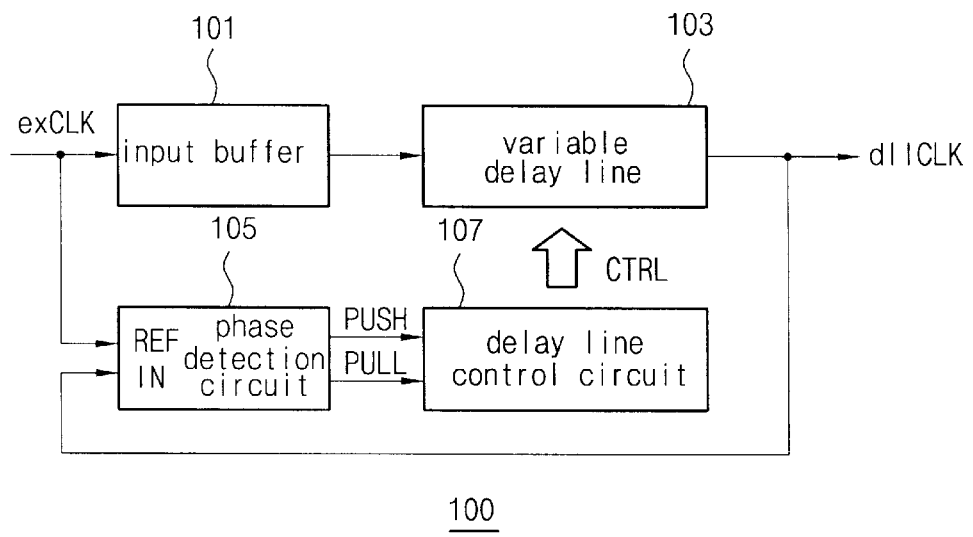
FIG. 1 is a block diagram of a conventional delay locked loop circuit.

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 2:
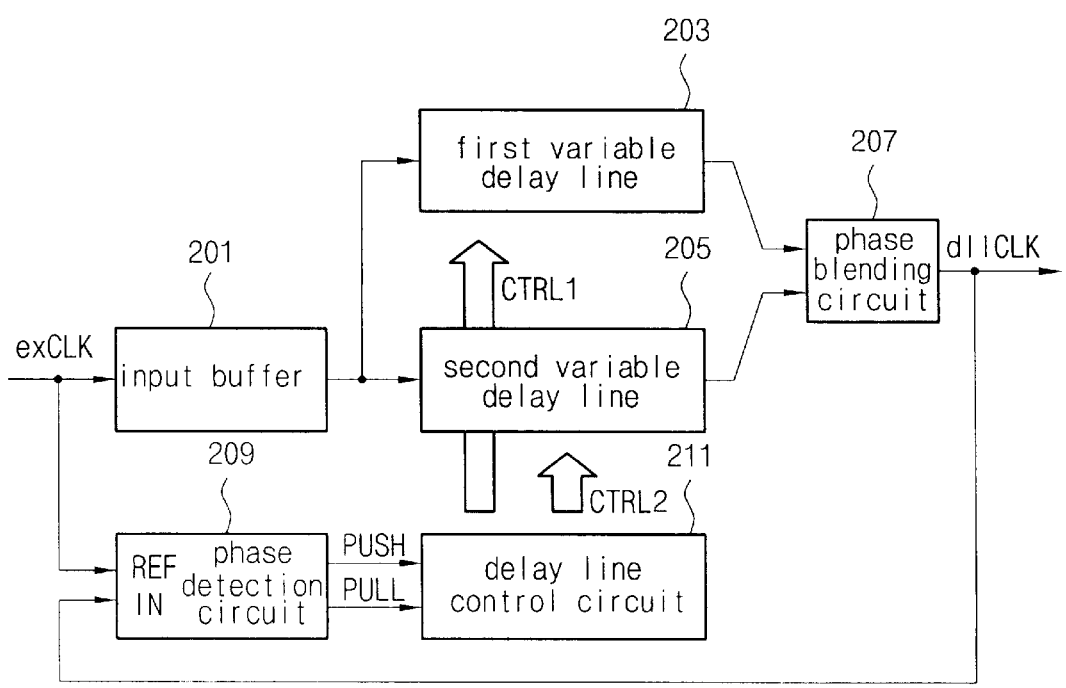
FIG. 2 is a block diagram of a delay locked loop circuit in accordance with the first embodiment of the present invention.

FIG. 2 is a block diagram of a delay locked loop circuit in accordance with a first embodiment of the present invention. Referring to FIG. 2, it is characterized in that the delay locked loop circuit 200 in accordance with the first embodiment of the present invention includes two variable delay lines 203, 205 and a phase blending circuit 207, compared with the conventional delay locked loop circuit 100 shown in FIG. 1.

As shown in FIG. 2, an input buffer 201 receives an external clock signal exCLK and converts it to a signal level of an internal circuit to generate an internal clock signal inCLK. The input buffer 201 provides the signal inCLK to the first variable delay line 203 and the second variable delay line 205. The first delay line 203 delays the internal clock signal inCLK by a period determined according to a control signal CTRL1 from a delay line control circuit 211 in order to generate a clock signal CLK1. The clock signal CLK1 is supplied to a phase blending circuit 207. The second variable delay line 205 also delays the internal clock signal inCLK by a period determined according to a control signal CTRL2 from the delay line control circuit 211 in order to generate a clock signal CLK2. The clock signal CLK2 is supplied to the phase blending circuit 207. The phase blending circuit 207 receives the two clock signals CLK1 and CLK2 and then generates a clock signal dllCLK having an intermediate phase between the two the clock signals CLK1 and CLK2. The clock signal dllCLK is provided as an output clock signal of the present DLL circuit 200. The output clock signal dllCLK is fed back to a phase detection circuit 209. The phase detection circuit 209 receives the external clock signal exCLK and the output clock signal dllCLK to detect a phase difference between the two clock signals. As a result of the phase difference detection, in the case that the phase of the output clock signal dllCLK is ahead of that of the external clock signal exCLK, the phase detection circuit 209 activates a phase push signal PUSH. In the other hands, in the case that the phase of the output clock signal dllCLK is behind that of the external clock signal, the phase detection circuit 209 activates a phase pull signal PULL. In this way, in the case that the phase push signal PUSH or phase pull signal PULL is activated, the delay line control circuit 211 generates the control signal CTRL1 for increasing or decreasing the delay by a unit delay in order to provide the control signal CTRL1 to the first variable delay line 203, or generates the control signal CTRL2 in order to provide the control signal CTRL2 to the second variable delay line 205.

Now, a case will be described in which the DLL circuit 200 of FIG. 2 has smaller effective unit delay than the unit delay of the variable delay line. It is assumed that the delay line control circuit 211 performs the control for increasing the delay on the first variable delay line 203 and the second variable delay line 205 simultaneously. For example, in the case that the delay of a unit delay tUD is simultaneously added to both variable delay lines 203 and 205 by the phase push signal PUSH, the unit delay tUD is added to both input signals CLK1 and CLK2 of the phase blending circuit 207. Accordingly, the same change as that described above will be also generated in the phase of the output clock signal dllCLK, as in the following equation 1.

$$\varphi' = (\varphi A + tUD + \varphi B + tUD)/2 = (\varphi A + \varphi B)/2 + tUD \quad \text{Equation 1}$$
$$= \varphi + tUD$$

wherein, φ is the phase of the output clock signal dllCLK before the unit delay tUD is added to both input signals CLK1 and CLK2, φ' is the phase of the output clock signal dllCLK after the delay of the unit delay tUD is added, and φA and φB are the respective phases of the input signals CLK1 and CLK2 before the unit delay tUD is added. That is, the final unit delay is not different from that of the respective variable delay line. However, if changing one of the two variable delay lines, the following equation 2 is obtained.

$$\varphi' = (\varphi A + \varphi B + tUD)/2 = (\varphi A + \varphi B)/2 + tUD/2 \quad \text{Equation 2}$$
$$= \varphi + tUD/2$$

That is, the phase of the output clock signal dllCLK is changed by tUD/2. The case of the phase pull signal PULL is also the same. If alternately controlling the two variable delay lines 203 and 205, based on the detection result from the phase detection circuit 209, even if the unit delay of the variable delay line itself is tUD, the only final obtainable effective delay is tUD/2.

Figure 3:
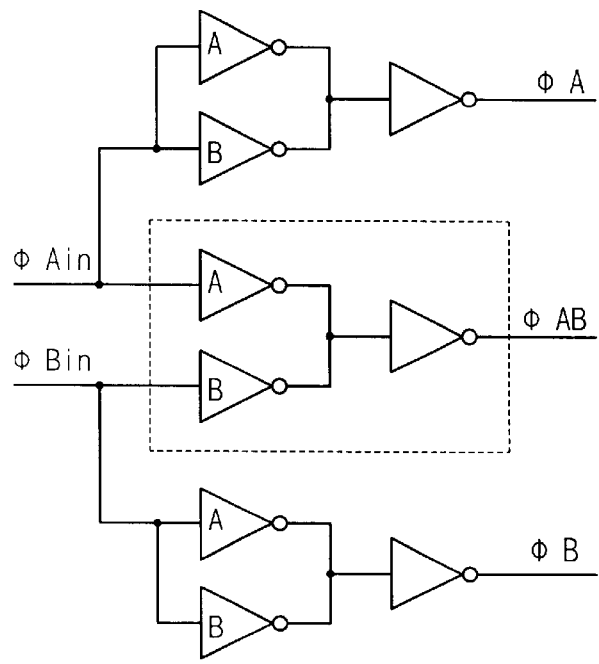
FIG. 3 is a circuit diagram of an example of the phase blending circuit shown in FIG. 2 and an operation waveform thereof.
Figure 3:
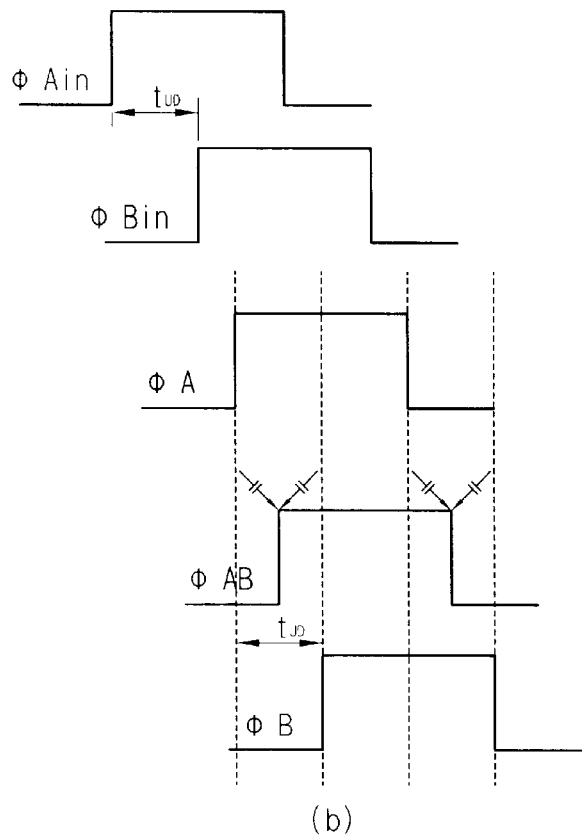

FIG. 3a is a circuit diagram of an example of the phase blending circuit shown in FIG. 2, and FIG. 3b is an operation waveform thereof. As shown in FIG. 3a, the phase blending circuit 300 may only consist of inverters. Only the part 301 surrounded with the dotted lines of FIG. 3a corresponds to the phase blending circuit and the remaining parts are provided to easily describe the operation of the present circuit 300. In FIG. 3, φAin represents the phase of the clock signal CLK1 and φBin represents the phase of the clock signal CLK2 respectively. In FIG. 3, an inverter 303a receives and inverts the first delayed input clock signal φAin, and an inverter 305a receives and inverts the second delayed input clock signal φBin. An inverter 307b inverts the output signals of the inverters 303a, 305a. As shown in FIG. 3, the input terminal of the inverter 307a is electrically connected to the output terminals of the inverters 303a, 305a. The output signal of the inverter 307a is provided as a phase blended clock signal. The sizes of the inverter 303a and the inverter 305a must be adjusted appropriately so that the output signal φAB has the intermediate phase between the input signals φAin and φBin.

Referring to FIG. 3b, the operation of the phase blending circuit 300 will be described. FIG. 3b shows the case that the input signal φBin is ahead of the input signal φAin by the amount of the unit delay tUD. If it is assumed that tD1 is the time period for the input signal φAin to be provided to inverters 303b and 305b and then to be outputted via inverter 307b as the output signal φA, the time period for the input signal φBin to be provided to inverters 303c and 305c and then outputted via inverter 307c as the output signal φB, is also approximately equal to tD1. Accordingly, the output signal φB also becomes ahead of the output signal φA by the amount of the unit delay tUD. The output signal φA is the case in which only the signal φAin is used as an input signal, and the output signal φB is the case in which only the signal φBin is used as the input signal. Accordingly, the output signal φAB using the two signals φAin and φBin as the input signals will be a signal having an approximate intermediate phase between the output signal φA and the output signal φB. As described above, there is a need to adjust the size ratio of the inverter 303a and the inverter 305a appropriately.

As apparent from the above description, it goes without saying that the improved effect of the unit delay will be obtained whatever type of variable delay line is used. Also, even if the output signal of the adopted phase blending circuit does not have a correct intermediate phase, it is likewise possible to decrease the effective unit delay.

Figure 4:
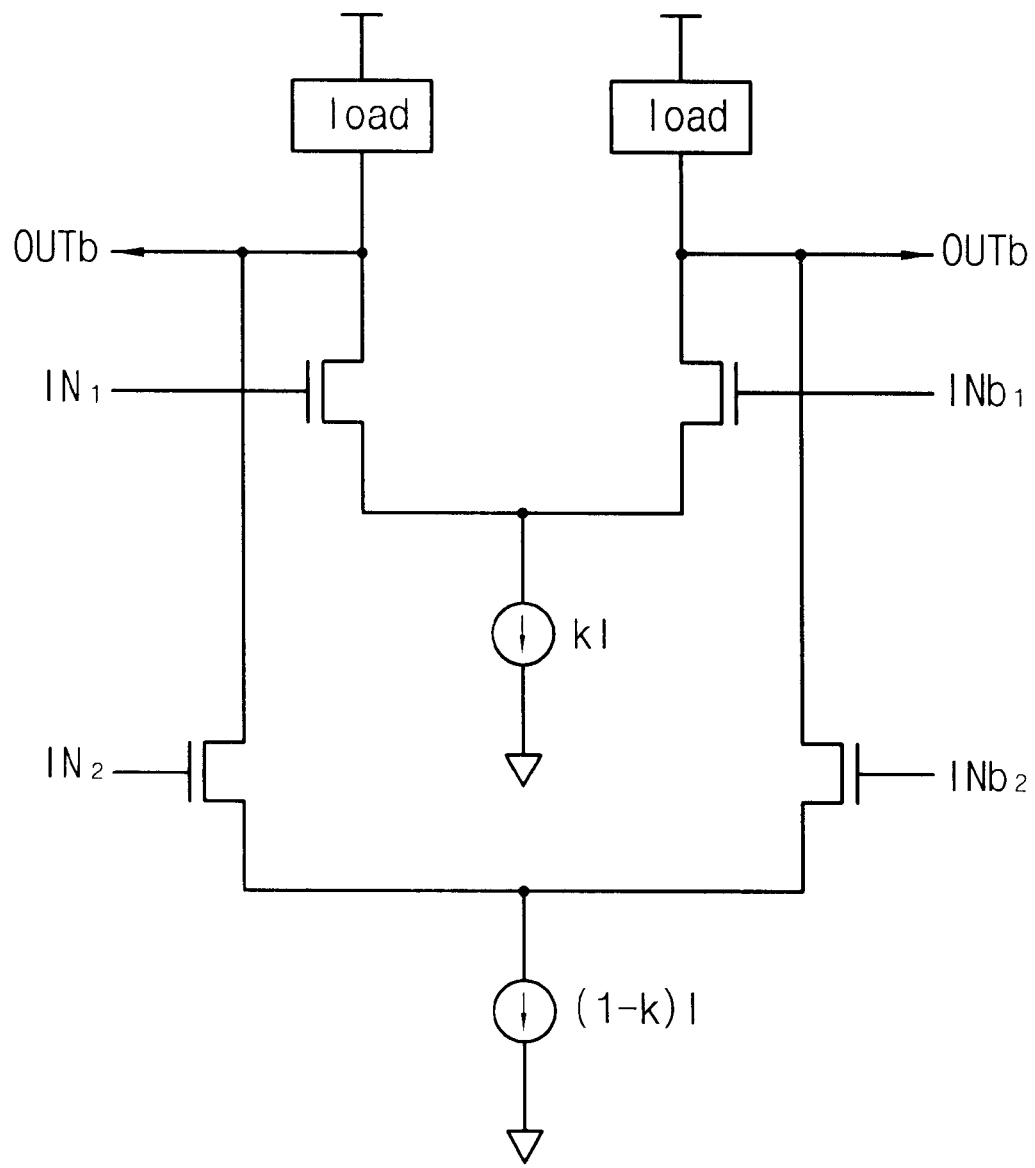
FIG. 4 is a circuit diagram of another example of the phase blending circuit shown in FIG. 2.

The phase blending circuit is changeable in various ways. FIG. 4 is a circuit diagram of another example of the phase blending circuit shown in FIG. 2. The phase blending circuit 400 shown in FIG. 4 is a differential type of circuit, and therefore is characterized in that it is resistant to a common mode signal such as noise. In FIG. 4, $IN_1$ and $Inb_1$ correspond to one input signal, where $Inb_1$ is the inverted signal of $IN_1$. $IN_2$ and $Inb_2$ correspond to another input signal, $Inb_2$ is the inverted signal of $IN_2$. In FIG. 4, kI and (1−k)I are current sources, whose current values are dependent on the value of k. In the case that the elements for implementing a circuit are in ideal condition, when k=0.5, the signal corresponding to the intermediate phase between the two input signals is outputted.

The current flowing to a load 401 is the sum of the current at which $IN_1$ flows to a NMOS transistor 405 through the gate thereof and the current at which $IN_2$ flows to a NMOS transistor 407, through the gate thereof. Likewise, the current flowing to a load 403 is the sum of the current at which $INb_1$ flows to a NMOS transistor 409, through the gate thereof and the current at which $INb_2$ flows to a NMOS transistor 411, through the gate thereof. For example, when k=1, output signals OUT and OUTb follow the phases of the input signals $IN_1$ and $INb_1$ Adversely, when k=0, the output signals OUT and OUTb follow the phases of the input signals $IN_2$ and $INb_2$. That is, as k is closer to 1, the output signals OUT and OUTb follow the phases of the input signals $IN_1$ and $INb_1$, and as k is closer to 0, the output signals OUT and OUTb follow the phases of the input signals $IN_2$ and $INb_2$.

Figure 5:
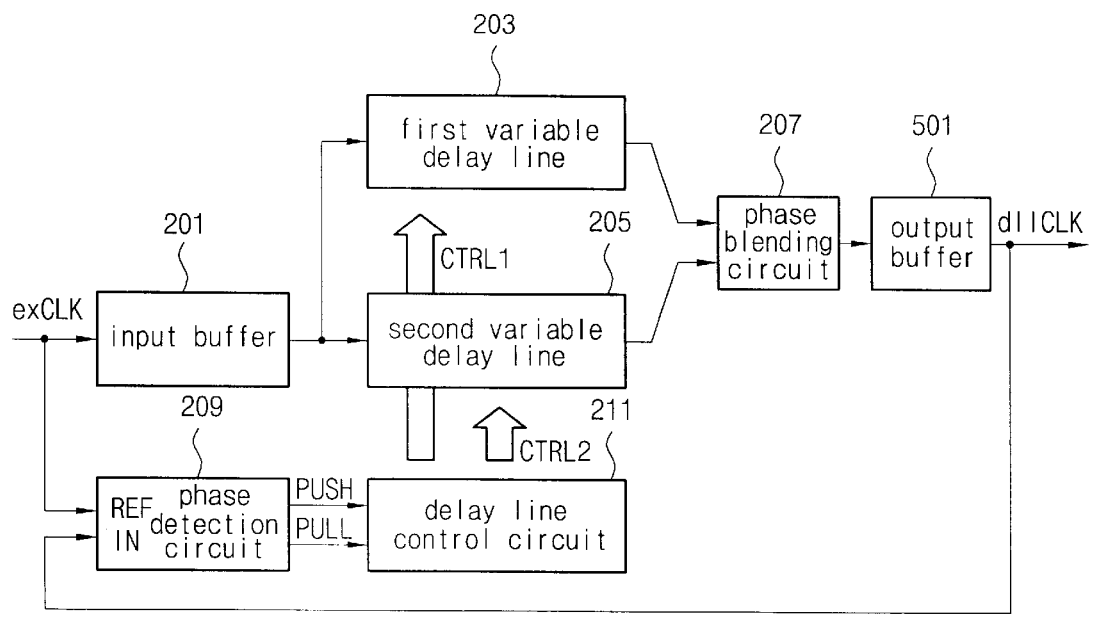
FIG. 5 is a block diagram of a delay locked loop circuit in accordance with the second embodiment of the present invention.

The characteristics of the present invention as described above are of course applicable to various structures of delay locked loop circuits. FIG. 5 is a block diagram of a delay locked loop circuit in accordance with the second embodiment of the present invention. In FIG. 5, an output buffer circuit 501 is further provided after the phase blending circuit 207. In the present delay locked loop circuit 500, the output signal of the phase blending circuit 207 is provided to the output buffer circuit 501, and the output buffer circuit 501 converts the output signal of the phase blending circuit 207 into a signal capable of driving a circuit at the next stage in order to provide it as an output signal dllCLK. In the present delay locked loop circuit 500, to compare with the phase of the external clock signal exCLK, not the output signal of the phase blending circuit 207, but the output signal of the output buffer circuit 501 is fed back to the phase detection circuit 209. The operation of the remaining parts is the same as described above with reference to FIG. 2.

Figure 6:
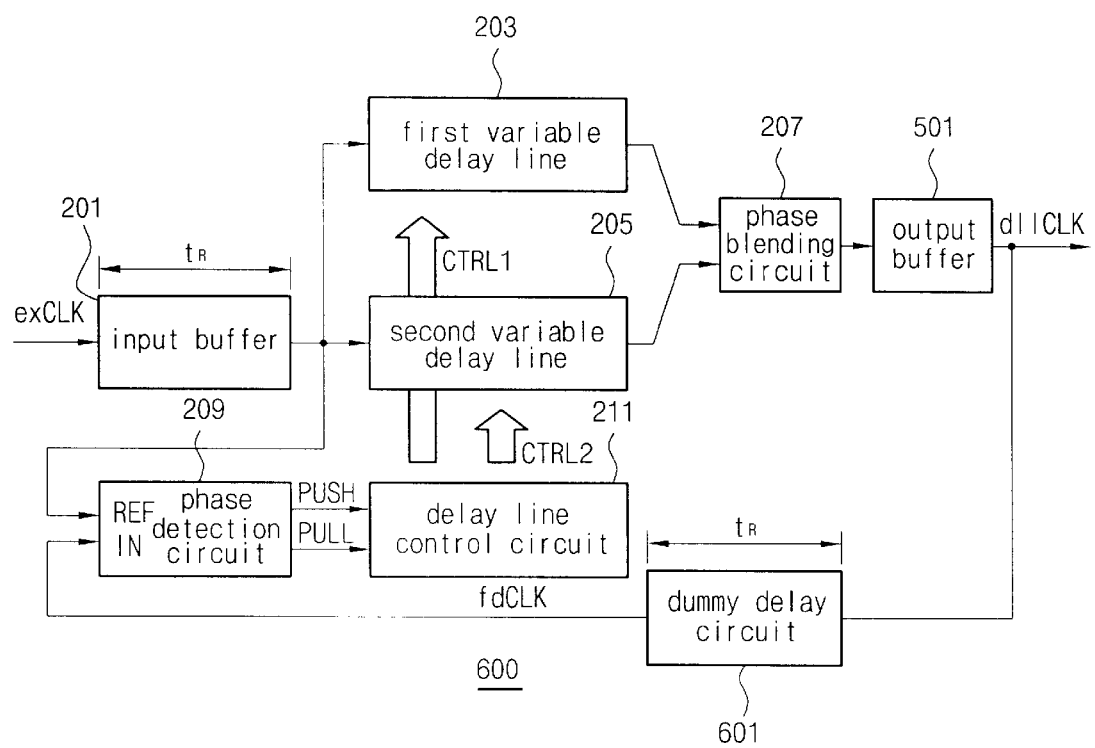
FIG. 6 is a block diagram of a delay locked loop circuit in accordance with the third embodiment of the present invention.

FIG. 6 is a block diagram of a delay locked loop circuit in accordance with the third embodiment of the present invention. In FIG. 6, the output signal of an input buffer 201 is used as a reference signal in the phase detection circuit 209. In the present delay locked loop circuit 600, a dummy delay circuit 601, having the same level of time delay for compensating a time delay tR by the input buffer 201 is inserted into a feedback loop. The dummy delay circuit 601 delays the output clock signal dllCLK by the signal delay tR in the input buffer 201, generates a feedback clock signal fbCLK1, and then provides the feedback clock signal fbCLK1 to the phase detection circuit 209. The operation of the remaining parts is the same as described above with reference to FIG. 2.

Figure 7:
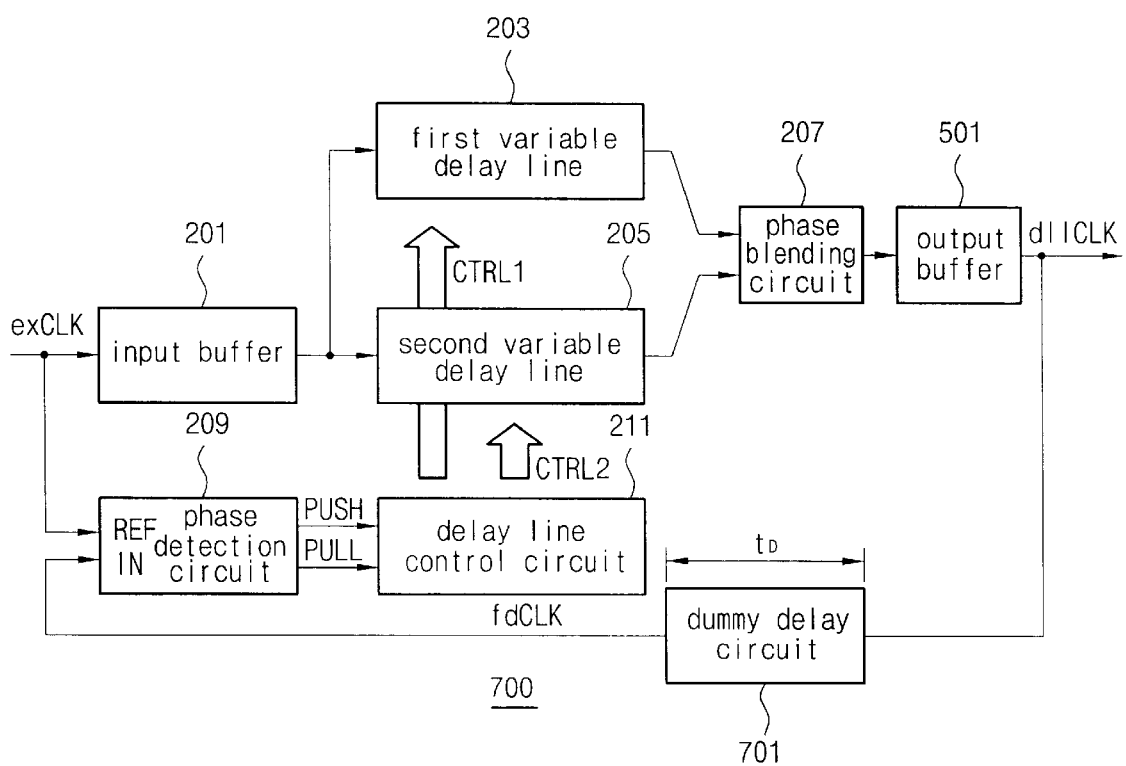
FIG. 7 is a block diagram of a delay locked loop circuit in accordance with the fourth embodiment of the present invention.

FIG. 7 is a block diagram of a delay locked loop circuit in accordance with the fourth embodiment of the present invention, wherein the phase of the output clock signal dllCLK has ahead of that of the external clock signal exCLK. For this embodiment, a delay locked loop circuit 700 includes a dummy delay circuit 701 for delaying the output clock signal dllCLK by a predetermined time period tD2 as shown in FIG. 7. The dummy delay circuit 701 is inserted to the feedback loop. The external clock signal exCLK is provided as a reference signal of the phase detection circuit 209. An output signal fbCLK2 of the dummy delay circuit 701 is provided as an input signal. The operation of the remaining parts is the same as described above with reference to FIG. 2.

Figure 8:
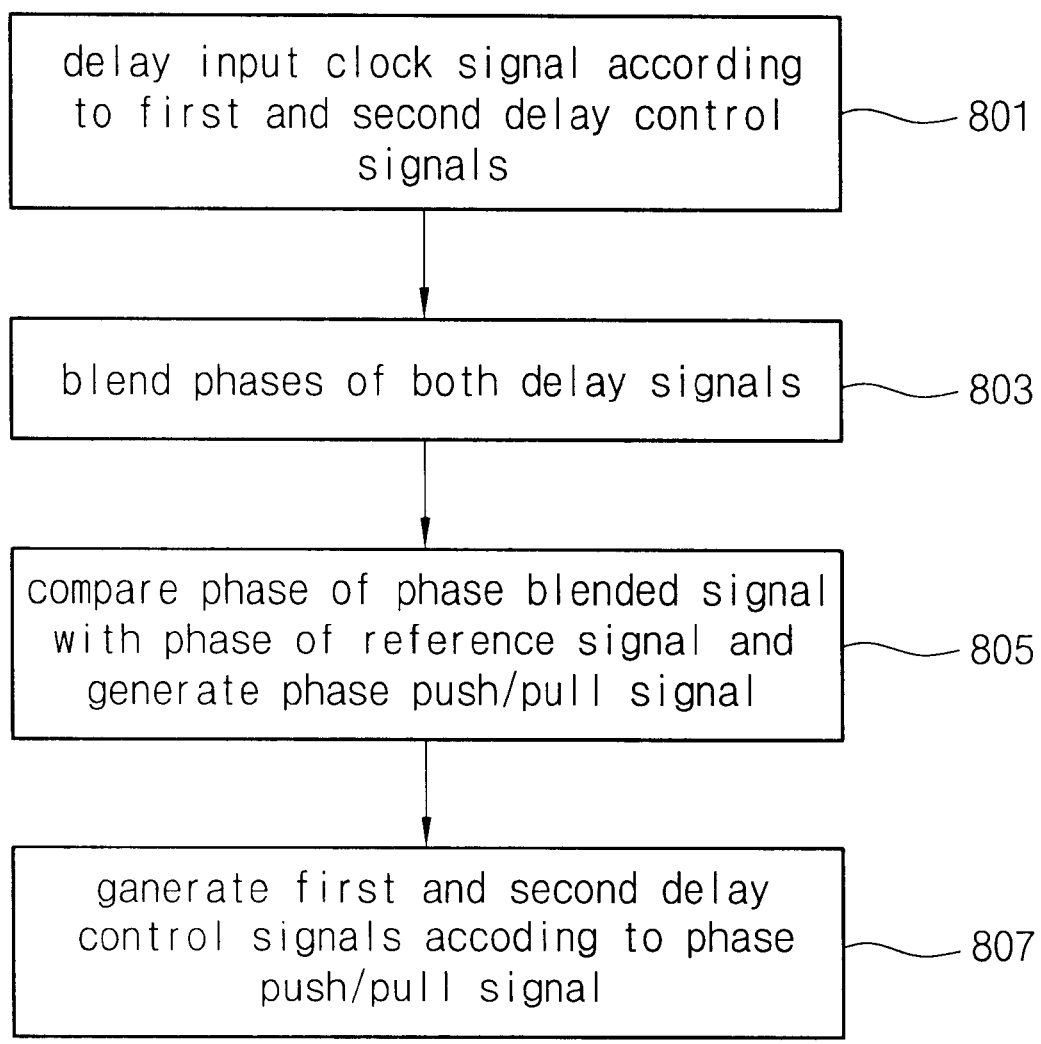
FIG. 8 is a flowchart illustrating a clock signal generating method in accordance with the present invention.

FIG. 8 is a flowchart illustrating a clock signal generating method in accordance with the present invention. As shown in FIG. 8, firstly, after an input clock signal and a first delay control signal are received, the input clock signal is delayed by a period determined according to the first and second delay control signals in order to generate a first delayed input clock signal. Likewise, after the input clock signal and a second delay control signal are received, the input clock signal is delayed by a period determined according to the second delay control signals 801 in order to generate a second delayed input clock signal. Then, the first and second delayed input clock signals are received and the phases of the first and second delay input clock signals are blended to generate a phase blended clock signal 803. Under these conditions, the phase blending means generating a clock signal having the intermediate phase between two target clock signals. Then, after the reference clock signal and the phase blended clock signal are received, in the case that the phase of the phase blended clock signal is ahead of that of the reference clock signal, a phase push signal is generated, and in the case that the phase of the phase blended clock signal is behind that of the reference clock signal, a phase pull signal is generated 805. Then, a first control signal and a second control signal are provided to increase the delay when the phase push signal is generated and decrease the delay when the phase pull signal is generated 807. The first delay control signal and the second delay control signal are not generated simultaneously and are generated in alternation.

Figure 9:
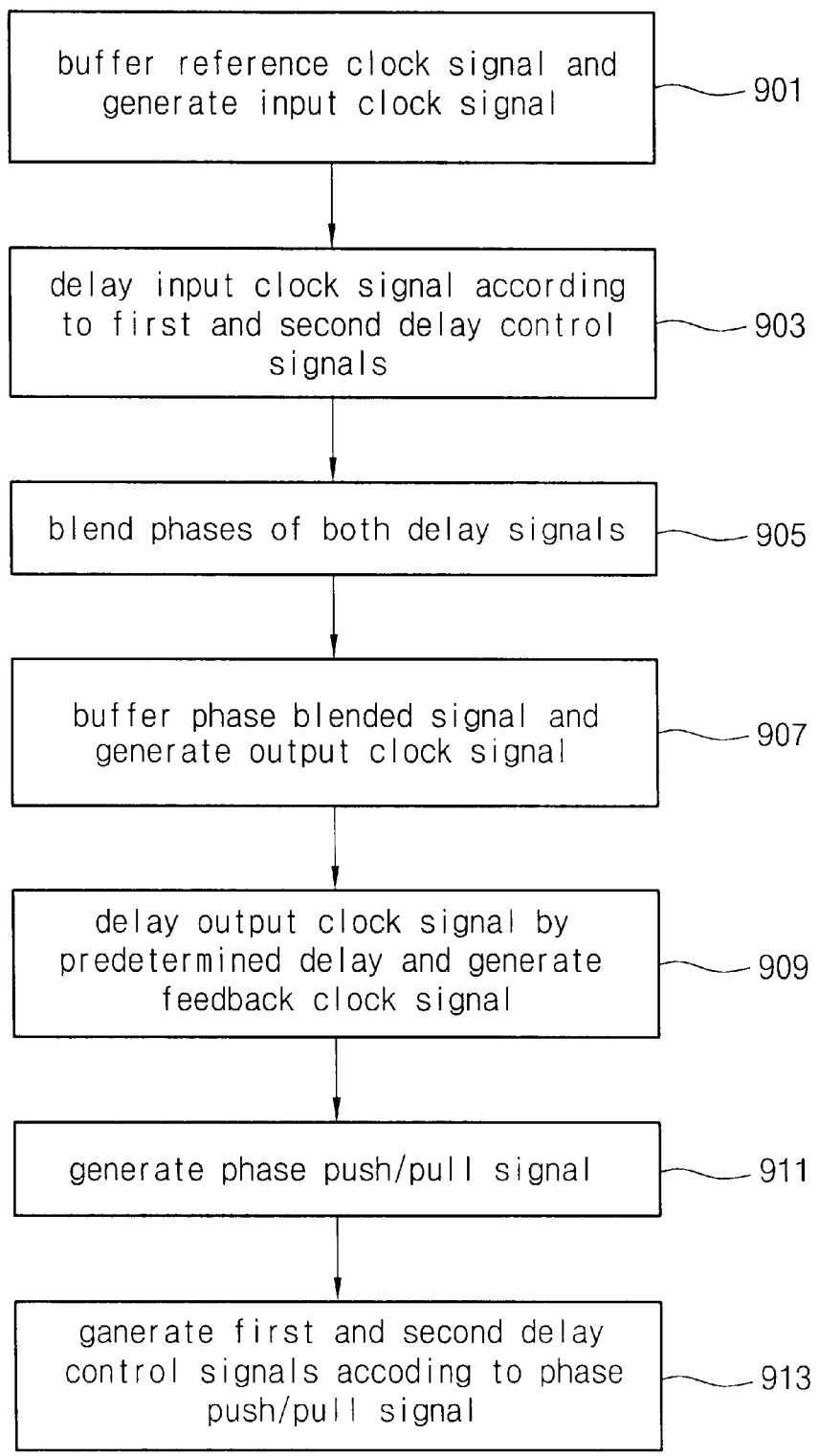
FIG. 9 is a flowchart illustrating another clock signal generating method in accordance with the present invention.

FIG. 9 is a flowchart illustrating another clock signal generating method in accordance with the present invention. If compared with the clock signal generating method shown in FIG. 8, the present method may further include a step 901 for generating an input clock signal having a signal level adapted to the next signal which is processed by receiving a reference clock signal inputted from the exterior and buffering the reference clock signal. Next, like steps 801, 803 of FIG. 8, the input clock signal is delayed according to the first and second delay control signals 903, and a clock signal (that is, a phase blended signal) is generated having the intermediate phase between the two delayed signal (905). Then, the phase blended signal may be buffered to generate an output clock signal (907). This buffering is for generating signals capable of driving the circuit at the next stage. Under these conditions, when the phase detection signal (that is, a phase push signal or phase pull signal) is generated, instead of the phase blended signal, the buffered output clock signal is used. The output clock signal may be received and then delayed by a predetermined time period to generate a feedback clock signal (909). In this case, the feedback clock signal is an output clock signal delayed by the period in which the input clock signal is generated (901). In this situation, when the phase detection signal is generated, instead of the reference clock signal, the input clock signal is used, and instead of the output clock signal, the feedback clock signal is used. The feedback clock signal may be an output clock signal delayed by a predetermined period. Also, in this case, when the phase detection signal is generated, instead of the output clock signal, the feedback clock signal is used. Step 911 of generating the phase push signal or the phase pull signal and step 913 of generating the first or second delay control signal according to the phase push signal or the phase pull signal are the same as steps 805, 807 of FIG. 8.

Although preferred embodiments of the present invention have been described for illustrative purposes, those skilled in the art will appreciate that various modifications, additions and substitutions are possible, without departing from the scope and spirit of the invention as disclosed in the accompanying claims.

In accordance with the present invention as described above, it is possible to decrease an effective unit delay easily without decreasing the unit delay of the variable delay line itself, by using one more variable delay line than the present conventional construction and generating a signal having the intermediate phase between the output signals from the two variable delay lines.

What is claimed is:

1. A circuit for generating an output clock signal having controlled timing, comprising:

a first delay circuit which receives an input clock signal in order to generate a first delayed input clock signal, in which the first delayed input clock signal is an input clock signal delayed by a period determined according to a first delay control signal inputted to the first delay circuit;

a second delay circuit which receives the input clock signal in order to generate a second delayed input clock signal, in which the second delayed input clock signal is an input clock signal delayed by a period determined according to a second delay control signal inputted to the second delay circuit;

a phase blending circuit which receives the first and second delayed input clock signals and blending the phases of the first and second delayed input clock signals in order to generate a phase blended clock signal;

a phase detection circuit which receives a reference clock signal and the phase blended clock signal in order to generate a phase push signal in the case that a phase of the phase blended clock signal is ahead of that of the reference clock signal, and generate a phase pull signal in the case that the phase of the phase blended clock signal is behind that of the reference clock signal; and a delay control circuit which generates the first or second delay control signal in order to increase the delay when the phase push signal is received from the phase detection circuit and decrease the delay when the phase pull signal is received from the phase detection circuit.

2. The circuit according to claim 1, wherein the first delay control signal and the second delay control signal is generated in alternation.

3. The circuit according to claim 1, wherein the first delay control signal and the second delay control signal are not generated simultaneously.

4. The circuit according to claim 1, further comprises an input buffer for generating the input clock signal by receiving and buffering the reference clock signal.

5. The circuit according to claim 1, further comprises an output buffer for generating the output clock signal by receiving and buffering the phase blended clock signal, wherein instead of the phase blended clock signal, the output clock signal is provided to the phase detection circuit.

6. The circuit according to claim 5, further comprises a dummy delay circuit for receiving the output clock signal to generate a feedback clock signal, in which the feedback clock signal is a delayed signal of the output clock signal by the delay in the input buffer, wherein instead of the reference clock signal, the input clock signal is provided to the phase detection circuit, and instead of the output clock signal, the feedback clock signal is provided to the phase detection circuit.

7. The circuit according to claim 5, further comprises a dummy delay circuit which receives the output clock signal in order to generate a feedback clock signal, in which the feedback clock signal is an output clock signal delayed by a predetermined period, wherein instead of the output clock signal, the feedback clock signal is provided to the phase detection circuit.

8. The circuit according to claim 1, wherein the phase blending circuit comprises, a first inverter for receiving and inverting the first delayed input clock signal;

a second inverter for receiving and inverting the second delayed input clock signal; and a third inverter for inverting output signals from the first and second inverters, in which an input terminal of the third inverter is connected to output terminals of the first and second inverters, and an output signal from the third inverter is provided as the phase blended clock signal.

9. A circuit for generating an output clock signal having controlled timing, comprising:

an input buffer for generating an input clock signal by receiving and buffering a reference clock signal;

a first delay circuit which receives the input clock signal to generate a first delayed input clock signal, in which the first delayed input clock signal is an input clock signal delayed by a period determined according to a first delay control signal inputted to the first delayed circuit;

a second delay circuit which receives the input clock signal to generate a second delayed input clock signal, in which the second delayed input clock signal is an input clock signal delayed by a period determined according to a second delay control signal inputted to the second delayed circuit;

a phase blending circuit for receiving the first and second delayed input clock signals and blending phases of the first and second delayed input clock signals to generate a phase blended clock signal;

an output buffer which receives and buffers the phase blended clock signal in order to generate the output clock signal;

a phase detection circuit which receives the reference clock signal and the output clock signal in order to generate a phase push signal in the case that a phase of the output clock signal is ahead of that of the reference clock signal and to generate a phase pull signal in the case that the phase of the output clock signal is behind that of the reference clock signal; and a delay control circuit which generates the first or second delay control signal in order to increase the delay when the phase push signal is received from the phase detection circuit and decrease the delay when the phase pull signal is received from the phase detection circuit, in which the first delay control signal and the second delay control signal are not generated simultaneously.

10. The circuit according to claim 9, wherein the first and second control signals are generated in alternation.

11. The circuit according to claim 9, circuit further comprises a dummy delay circuit for receiving the output clock signal to generate a feedback clock signal, in which the feedback clock signal is an output clock signal delayed by the delay in the input buffer, wherein instead of the reference clock signal, the input clock signal is provided to the phase detection circuit, and instead of the output clock signal, the feedback clock signal is provided to the phase detection circuit.

12. The circuit according to claim 9, further comprise a dummy delay circuit which receives the output clock signal in order to generate a feedback clock signal, in which the feedback clock signal is an output clock signal delayed by the period in the input buffer, wherein the feedback clock signal is provided to the phase detection circuit, instead of the output clock signal.

13. The circuit according to claim 9, wherein the phase blending circuit comprises, a first inverter for receiving and inverting the first delayed input clock signal;

a second inverter for receiving and inverting the second delayed input clock signal; and a third inverter for inverting output signals from the first and second inverters, in which an input terminal of the third inverter is connected to output terminals of the first and second inverters, and an output signal of the third inverter is provided as the phase blending clock signal.

14. A method for generating a clock signal having controlled timing, the method comprising the steps of:
generating a first delayed input clock signal, by delaying an input clock signal by a period determined according to a first delay control signal, after receiving the input clock signal and the first delay control signal;
generating a second delayed input clock signal, by delaying an input clock signal by a period determined according to a second delay control signal, after receiving the input clock signal and the second delay control signal;
generating a phase blended clock signal by receiving the first and second delayed input clock signals and blending phases of the first and second delayed input clock signals;
after receiving a reference clock signal and the phase blended clock signal, generating a phase push signal in the case that a phase of the phase blended clock signal is ahead of that of the reference clock signal and generating a phase pull signal in the case that the phase of the phase blended clock signal is behind that of the reference clock signal; and
generating a first or second delay control signal for increasing the delay when the phase push signal is generated and for decreasing the delay when the phase pull signal is generated.

15. The method according to claim 14, wherein the first delay control signal and the second delay control signal are not generated simultaneously and are generated in alternation.

16. The method according to claim 14, the method further comprises a step of generating the input clock signal by receiving and buffering the reference clock signal.

17. The method according to claim 14, further comprises a clock buffering step for generating the output clock signal by receiving and buffering the phase blended clock signal, wherein in the step of generating the phase push or pull signal, instead of the phase blended clock signal, the output clock signal is used.

18. The method according to claim 17, further comprises a dummy clock receiving step for receiving the output clock signal to generate a feedback clock signal, in which the feedback clock signal is an output clock signal delayed by the period in the dummy clock receiving step, wherein in the step of generating the phase push or pull signal, instead of the reference clock signal, the input clock signal is used, and instead of the output clock signal, the feedback clock signal is used.

19. The method according to claim 17, further comprises a dummy delay step for receiving the output clock signal to generate a feedback clock signal, in which the feedback clock signal is an output clock signal delayed by a predetermined period, wherein in the step of generating the phase push or pull signal, instead of the output clock signal, the feedback clock signal is used.

* * * * *